United States Patent [19]

Okinaka et al.

[11] Patent Number: 4,469,564
[45] Date of Patent: Sep. 4, 1984

[54] COPPER ELECTROPLATING PROCESS

[75] Inventors: Yutaka Okinaka, Madison; Craig G. Smith, North Plainfield; Lawrence E. Smith, Plainfield, all of N.J.

[73] Assignee: AT&T Bell Laboratories, Murray Hill, N.J.

[21] Appl. No.: 407,151

[22] Filed: Aug. 11, 1982

[51] Int. Cl.³ .......................... C25D 3/38; C25D 7/00
[52] U.S. Cl. ................................ 204/15; 204/52 R; 204/252
[58] Field of Search ................ 204/52 R, 52 Y, 106, 204/107, 108, 252, 23, 15

[56] References Cited

U.S. PATENT DOCUMENTS

| | | | |
|---|---|---|---|
| 2,707,166 | 4/1955 | Brown et al. | 204/52 R |
| 3,124,520 | 3/1964 | Juda | 204/52 R X |
| 3,328,273 | 6/1967 | Creutz et al. | 204/52 R |
| 3,537,961 | 11/1970 | White et al. | 204/52 R X |
| 4,073,708 | 2/1978 | Hicks | 204/106 X |
| 4,269,670 | 5/1981 | Smith | 204/15 |
| 4,310,391 | 1/1982 | Okinaka et al. | 204/46 G |

FOREIGN PATENT DOCUMENTS 591894  2/1960  Canada ............................ 204/52 R

OTHER PUBLICATIONS

Proceedings of the 8th Congress of the International Union for Electrodeposition and Surface Finishing, "Function and Structure of Organic Additives in Electroplating", H. Brown, pp. 114-121, 1973.
Plating and Surface Finishing, vol. 68, pp. 46-49, 1981, "Characteristics of Acid Copper Sulfate Deposits for Printed Wiring Board Applications", L. Mayer and S. Barbieri.
Encyclopedia of Electrochemistry, pp. 726-735, 1964.

Primary Examiner—G. L. Kaplan
Attorney, Agent, or Firm—Walter G. Nilsen

[57] ABSTRACT

A copper electroplating process is described in which the anode is surrounded by a cation-permeable membrane so as to prevent decomposition of additives in the electrochemical bath. Such a feature adds to bath lifetime and permits better control of bath chemistry and plating quality during the electroplating process. The feature is especially advantageous for copper electroplating processes using nonconsumable electrodes because of the high consumption of additives and that the copper can be added to the cathode side of the membrane so that acid copper ions need not pass through the membrane.

26 Claims, 2 Drawing Figures

COPPER ELECTROPLATING PROCESS

TECHNICAL FIELD

The invention is a process for electroplating copper.

BACKGROUND OF THE INVENTION

Copper electrodeposition is used extensively in a variety of industrial applications including electroforming, electrorefining, manufacture of copper powder and electroplating. In electrorefining, relatively impure copper is generally dissolved from a consumable copper electrode and plated out in relatively pure form on a cathode. Electroforming is also extensively done in industry to produce various copper articles such as, electrotypes, phonograph records, band instruments, heat exchangers, reflectors, etc.

Copper electroplating is used in the production of many electrical devices and circuits. In many such applications, particularly in the production of circuit boards for electronic circuits, a copper electroplating process is used with nonconsumable electrodes. Such processes are more versatile than those using consumable electrodes, permit higher plating speeds, better control of the bath composition, require smaller apparatus size and generally yield copper layers with excellent physical properties. Particularly advantageous is the fact that the anode does not change size (i.e., cell geometry remains fixed) so that more uniform plating results are obtained. In addition, the copper salts used to provide the source of copper are often available as products of etching procedures associated with the production of copper plated devices. For example, in the production of circuit boards, a copper layer is put down over the entire surface of an insulating substrate and part of the copper etched off to produce the circuit board of interest.

Copper plating is used extensively in a variety of manufacturing procedures. It is used to prevent corrosion on various surfaces (i.e., iron surfces), as a binding layer for additional metal layers, to increase electrical or thermal conductivity and to provide conducting paths in many electrical applications. Indeed, such of the recent increase in the activity in copper electroplating is in the manufacture of electrical devices, such as circuit boards, integrated circuits, electrical contact surfaces, etc.

Particularly important in any electroplating process is the stability and lifetime of the electroplating bath. Many electroplating baths contain additives which improve various aspects of the plating process. In particular, additives are used to improve the brightness of the copper plating, the physical properties of the plated copper particularly with respect to ductility and the micro-throwing power as well as macro-throwing power of the plating bath. Increased stability of these additives leads to longer lifetimes for the electroplating bath which is economically very important. For example, frequent replacement of the bath interrupts the copper plating operation which reduces product yield and requires replacement of the chemicals in the new bath as well as disposal of the chemicals in the old bath.

SUMMARY OF THE INVENTION

The invention is a copper electroplating process using consumable or nonconsumable anode in which the anode is surrounded by a cation exchange membrane. This membrane prevents certain components of the bath (e.g., organic additives) from contacting the anode but permits easy passage of positive ions (generally hydrogen ions) in the electrolyte. Such a process increases bath lifetime because the additives are not affected by the electrochemical processes occurring at the anode. Such a process using the cation exchange membrane permits high speed copper electroplating without additive decomposition and allows better control of bath chemistry (e.g., additive concentration).

DETAILED DESCRIPTION

Figure 1:
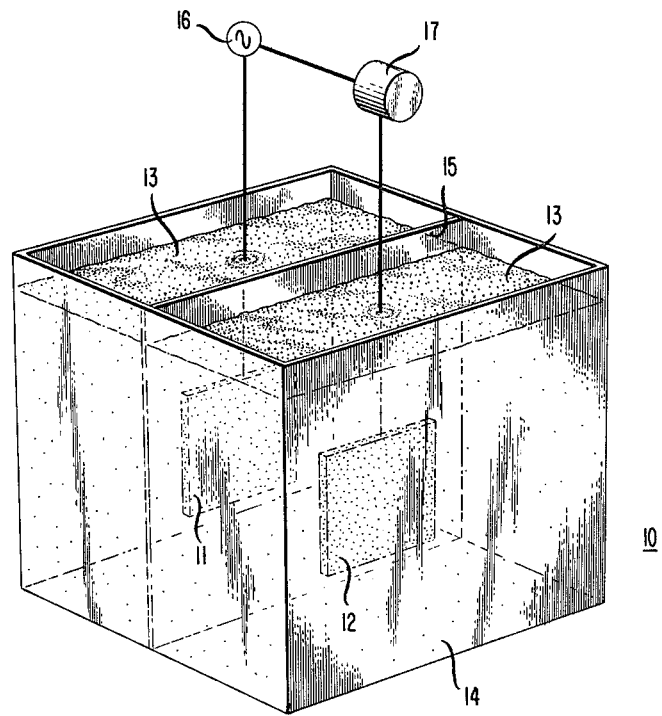
FIG. 1 shows a diagram of a copper electroplating cell with cathode (often a printed wiring board being plated with copper), anode and ion exchange membrane dividing the cell into two parts.

In broad terms, the invention is a copper electroplating process in which undesirable oxidation of certain components of the copper electroplating bath is prevented by use of a cation-permeable membrane or merely separating the anode from cathode. A large variety of copper electroplating processes may be used (bath composition, temperature, pH, anode structure including consumable and non-consumable electrodes, etc.) provided hydrogen ions must pass through the cation-permeable membrane. Hydrogen ions entering the cathode compartment should be neutralized in some way, typically by the addition of an alkaline agent.

In general terms, the copper electroplating process involves passing current through the anode, electroplating solution and cathode. The anode may be consumable (made of copper which dissolves and replenishes the solution as plating occurs) or nonconsumable (made of some inert material such as platinum, platinized titanium, lead, etc.) Generally, the invention is more useful for nonconsumable anodes where electroplating rates are greater and the problems associated with additive consumption (usually by oxidation at the anode) are greater.

Particularly useful nonconsumable electrodes involve surfaces with oxides of iridium and tantalum. Typical compositions are 20 to 90 mole percent iridium, remainder tantalum. Preferred is 60 to 90 mole percent iridium, remainder tantalum. Generally, these electrodes are made by coating these compounds on a conducting substrate such as a titanium substrate. There is evidence, although not conclusive, that the superior properties of these electrodes, especially as to long lifetimes and stability are due to the formation of a double oxide (an iridium-tantalum oxide) such as $Ir(TaO_3)_4$. Much of this work is disclosed in U.S. Pat. No. 4,310,391, issued to Y. Okinaka and C. G. Smith on Jan. 12, 1982.

Other electrodes are also useful in the practice of the invention. Particularly useful are those described in U.S. Pat. No. 4,269,670, issued to C. G. Smith on May 26, 1981. These electrodes comprise at least 10 mole percent group VIII metal, at least 10 mole percent valve metal and at least 5 mole percent binder metal. Group VIII metals include cobalt, nickel, ruthenium, rhodium, palladium, iridium and platinum. Valve metals include titanium, zirconium, hafnium, vanadium, niobium and tantalum. Binder metals include beryllium, calcium, strontium, barium, scandium, yttrium, lanthanum and the rare earth elements with atomic numbers 58 through 71. Particularly useful is an oxide composition with 5-20 mole percent barium, and the ratio of iridium to tantalum between ¼ and 4. Such a composition is 5 mole percent barium, 30-40 mole percent iridium, remainder tantalum.

A large variety of cation exchange membranes are useful in the practice of the invention. Various such membranes are described in references including the *Encyclopedia of Electrochemistry*, C. A. Hampel, ed., Reinhold, 1964, pp. 726-735.

Both heterogeneous and homogeneous cation-permeable membranes may be used in the practice of the invention. The heterogeneous membrane is made by dispersing finely ground ion-exchange resin throughout a thermoplastic matrix. For cation-permeable membrane, the resin is typically of the sulfonated styrene-divinylbenzene type and the matrix is typically a polymer such as polyethylene, polyvinyl chloride, polyvinylidene chloride, natural or synthetic rubber, etc.

The homogeneous type is made by condensation processes using sulfonated phenol and formaldehyde or nitrogen-containing compounds and formaldehyde. The condensates are laid out in thin sheets, with or without supports such as paper or plastic screen, before final gelation to an insoluble form. Other homogeneous membranes are prepared by the graft polymerization of polyethylene and styrene following the soaking of a film of polyethylene in styrene monomer. The film is then converted to a cation exchange membrane by sulfonation.

The preferred membrane is a copolymer of tetrafluoroethylene and perfluoro-3,6-dioxa-4-methyl-7-octenesulfamic acid. A typical product is marketed by Dupont Company under the trade name of Nafion. This product is readily available in a number of forms including sheets, tubes, etc., and achieves excellent results both as to the rate of exchange and stability toward the plating bath. A perfluorinated structure is preferred because of high chemical stability. High stability is exceedingly important because the membrane is exposed to corrosive chemicals for long periods of time.

The invention may be practiced on a large variety of copper baths including acid baths and alkaline baths. Obviously, the invention is only useful where additives (especially additives subject to anodic oxidation) are used in the bath. The bath contains a source of copper and a supporting electrolyte.

A variety of copper electroplating baths are described in a book entitled *Modern Electroplating*, edited by F. A. Lowenheim, John Wiley and Sons, Inc., New York, especially chapter 7 by A. K. Graham, W. H. Safranek and J. W. Dini.

Copper fluoborate baths are used to electroplate copper. The bath generally contains, in addition to additives discussed below, copper ion often added in the form of copper fluoborate and fluoboric acid. Boric acid is also added in many cases. The concentration of the various ingredients is not critical. Typical concentrations are: copper fluoborate 200-500 gms/liter; fluoboric acid 10-40 gms/liter and boric acid 10-40 gms/liter.

Pyrophosphate baths may also be used. Such baths have a number of advantages. They have high throwing power, are not corrosive and are not toxic. Typical concentration of constituents are copper ion ($Cu^{+2}$) 22-38 gms/liter, pyrophosphate $(P_2O_7)^{-4}$ 150-250 gms/liter, nitrate ion 5-10 gms/liter, ammonia 1-3 gms/liter and orthophosphate $(HPO_4)^{-2}$ no greater than 113 gms/liter.

Typical copper cyanide baths may also be used but considerable caution should be used since the anode side of the bath may become acidic, and rupture of the membrane may expose cyanide solution to acidic conditions, releasing poisonous HCN.

The preferred copper electroplating bath comprises copper sulfate in an acid solution. The concentration of copper and acid may vary over large limits. For copper, compositions generally vary from 0.05 Molar to saturation or, more preferably, from 0.05 Molar to 1.5 Molar. Acid concentration varies from 0.1 to 2 Molar and is generally added as sulfuric acid.

Special bath compositions are used for special applications. For example, high throwing power, it is preferred that the Molar acid concentration (generally as sulfuric acid) be at least 5 times the Molar concentration of copper ions. Plating results are often improved by the addition of chloride ions (generally in small amounts such as 30-100 mg/liter). The chloride ion is most conveniently added as hydrochloric acid.

A large variety of additives may be used in the practice of the invention. Usually, more than one additive is used, each additive performing a desirable function. Among these desirable functions is improved appearance (brightness), improved structure and improved physical properties (such as electrical conductivity or ductility) of the copper desposited. Particular additives (usually organic additives) are used for grain refinement, suppression of dendritic growth (treeing) and improved covering and throwing power. Typical additives used in electroplating are discussed in a number of references including *Modern Electroplating* cited above and by H. Brown in an article entitled "Function and Structure of Organic Additives in Electroplating" published in *The Proceedings of the 8th Congress of the International Union for Electrodeposition and Surface Finishing*, Forster-Verlag, A. G., Zurich, 1973, pp. 114-121. Lists of typical additives are found in these references. Additives for acid copper baths are also discussed by L. Mayer and S. Barbieri in an article entitled "Characteristics of Acid Copper Sulfate Deposits for Printed Wiring Board Applications", published in *Plating and Surface Finishing*, 68, (3), pp. 46-49 (1981).

Generally, there is a variety of additives used in copper electroplating baths. Aromatic and aliphatic quaternary amines are used to improve the brightness of the deposit. Polysulfide compounds are used to increase the ductility of the deposited copper and polyethers are used to improve the thickness uniformity of the copper plating. Some typical additives are disclosed in U.S. Pat. No. 3,328,273 issued to Hans-Gerhard Creutz et al on June 27, 1967.

The dyes of the phenazine class (the Safranine type) and more especially the phenazine azo dyes (the Janus Green B type) which make possible the greatly improved leveling and extended bright plating range can be represented by the following formula.

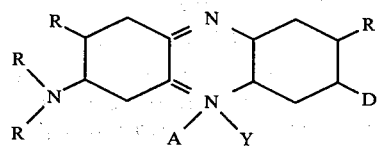

where
R is H, CH₃, or C₂H₅;
A is H, CH₃, C₃H₇, C₃H₅, C₃H₃, C₄H₉, C₆H₅CH₂, C₆H₅C₂H₄, HOC₂H₄, HSC₂H₄, C₆H₅, CH₃C₆H₄, (CH₃)₂C₆H₃;
Y is an anion from the group consisting of Cl⁻, Br⁻, SO₄⁻⁻, HSO₄⁻, CH₃SO₄⁻, C₂H₅SO₄⁻, C₂H₅SO₃⁻, C₃H₇SO₃⁻, ⁻O₃SCH₂SO₃⁻, ⁻O₃SC₂H₄SO₃⁻, HOC₂H₄SO₃⁻, HSC₃H₆SO₃⁻; and
D is H, CH₃, C₂H₅, OH, NH₂, N(CH₃)₂, N(C₂H₅)₂,

SH, and N=N−Z, where Z is a coupling group, such as dimethyl aniline, aniline, phenylene diamine, and substituted anilines and phenylene diamines, naphthols and substituted naphthols, phenols and substituted phenols, thiazoles, benzothiazoles and aminobenzothiazoles, coupled to the azo linkage N=N.

The preferred phenazine dyes are the Janus Green B type (Diethyl Safranine Azo Dimethyl Aniline or Dimethyl Safranine Azo Dimethyl Aniline, C.I. Nos. 11045, 11050), or the Janus Black R type, also C.I. 11975 (Colour Index, second edition, Vol. 3, 1956-57), as these compounds make possible the highest leveling and the widest bright plating range.

Typical structural formulas are as follows:

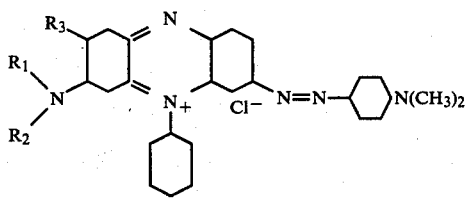

where R₁, R₂ and R₃ aliphatic hydrocarbon groups, are typically hydrogen, methyl or ethyl groups. For convenience, these compounds are identified as Janus Green B type compounds. Many structural formulas for these additives are given in U.S. Pat. No. 2,707,166 issued to H. Brown on Apr. 26, 1955.

Another closely related set of compounds are identified by the following structure:

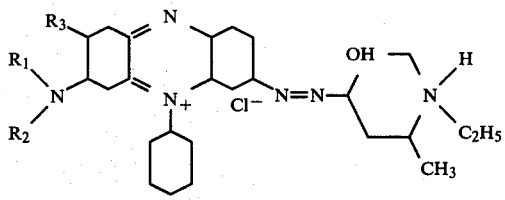

where R₁, R₂ and R₃ are aliphatic hydrocarbon groups, typically hydrogen, methyl or ethyl groups. This type of additive may be identified as a phenosafranine-3-ethylamino-p-cresol. Janus Black and Janus Blue type dyes are also useful. The structural formula for these dyes are given in U.S. Pat. No. 2,707,166.

Aliphatic quaternary amines are also used as brightening agents and to ensure excellent properties of the deposited copper. Generally, for stability and solubility reasons, the aliphatic quaternary amine should have between 3 and 10 carbon atoms.

Other types of additives are used to increase ductility of the deposited copper. Typically, they are polysulfide compounds disclosed in detail in U.S. Pat. No. 3,328,273 referred to above. The sulfide additives are aliphatic polysulfides of the general formula

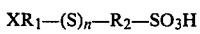

$XR_1-(S)_n-R_2-SO_3H$ in which R₁ and R₂ are alkylene groups containing 1 to 6 carbon atoms, X is hydrogen or SO₃H and n varies from 2 to 5. Typical polysulfides are given in Table I. Concentrations can vary over large limits but are typically between 0.0005 and 1.0 gms/liter.

TABLE I

| | Organic Polysulfide Compounds |
|---|---|
| (1) | CH₃—S—S—CH₂—SO₃H |
| (2) | CH₃—S—S—S—(CH₂)₄—SO₃H |
| (3) | HO₃S—CH₂—S—S—S—S—S—CH₂—SO₃H |
| (4) | HO₃S—(CH₂)₃—S—S—(CH₂)₃—SO₃H |
| (5) | (CH₃)₂CHCH₂—S—S—CH₂CH(CH₃)₂ |
| (6) | (CH₃)₃C—S—S—C(CH₂)₂SO₃H |
| (7) | HO₃S—(CH₂)₄—S—S—(CH₂)₄—SO₃H |

A polyether is also used as a leveling agent that improves thickness uniformity particularly in circuit boards with holes. Generally, best results are obtained with polyethers with at least six ether oxygen atoms and alkyl chains no larger than six carbon atoms. Typical polyeher compounds useful in copper electroplating are given in Table II of U.S. Pat. No. 3,328,273 cited above.

Particularly good results are obtained with polypropylene propanols and glycols with average molecular weight of about 360 to about 1,000, i.e., polyethers which contain the group $(C_3H_6O)_y$ where y is an integer with value from 6 to about 20. Excellent results are also obtained with polyethers containing the group $(C_2H_4O)_x$ where x is an integer of at least 6. Generally, x does not exceed 100.

FIG. 1 shows a typical copper electroplating apparatus 10 useful for electroplating various items such as circuit boards, etc. The experimental apparatus is also useful for demonstrating the advantages of the use of membranes in copper electroplating. The plating apparatus comprises anode or counterelectrode 11 and cathode 12 on which the copper is electroplated. Also shown is the electroplating bath 13 and container 14 for holding the electroplating bath. The electroplating bath is divided into two parts (anode compartment and cathode compartment) by a cation-permeable membrane 15 which provides easy passage of cations (generally hydrogen ions) but prevents passage of anions and neutral species such as organic additives, etc. Generally, the electroplating cell is initially set up so that the organic additives are in the cathode compartment and the cation-permeable membrane prevents passage of the organic additives to the anode compartment. The anode may be of the consumable or nonconsumable type. For nonconsumable anodes, the copper ions are generally added to the cathode compartment. Also shown in FIG. 1 is the electric power souce 16 and a current limiting device 17 to control plating rate.

Figure 2:
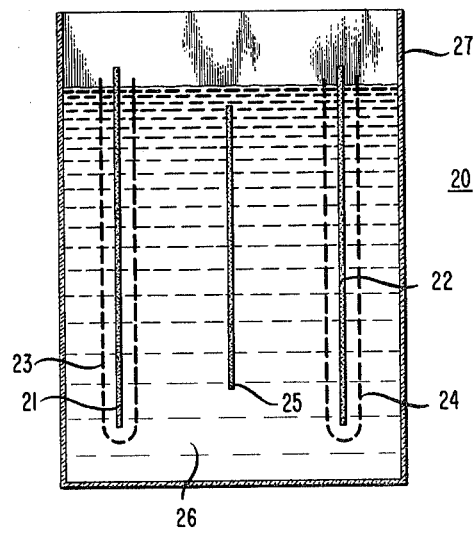
FIG. 2 shows a diagram of a copper electroplating cell with membrane immediately surrounding the anode.

FIG. 2 shows another type of electroplating apparatus 20 useful in the practice of the invention. Two anodes or counterelectrodes 21 and 22 are shown in which membrane material 23 and 24 surrounds the electrode. The cation-permeable membrane 23 and 24 is in the form of a tube or envelope so as to surround the anode. Generally, it is advantageous that the membrane not touch the anode over any significant area so that gases generated at the anode are not trapped. The cathode is generally located between the anodes. Additional anodes and cathodes may be used in the cell. The electrolyte 26 is located in a container 27 and covers at least part of the anode and cathode.

What is claimed is:

1. A process for electroplating copper onto a circuit board, said circuit board comprising an insulating substrate with a surface at least partially covered with copper comprising the step of passing current through an anode, copper electroplating bath and cathode, said electroplating bath comprising a source of copper and an organic additive, and in which said anode is nonconsumable characterized in that the anode is surrounded by a cation-permeable membrane so as to prevent organic additives in the bath from reaching the anode.

2. The process of claim 1 in which at least part of the surface of the nonconsumable anode comprises an active oxide, said active oxide comprising oxides of iridium and tantalum.

3. The process of claim 2 in which the active oxide comprises oxidized metals, said oxidized metals consisting essentially of 20 to 90 mole percent iridium, remainder tantalum.

4. The process of claim 3 in which the oxidized metals consists essentially of 60 to 90 mole percent iridium, remainder tantalum.

5. The process of claim 1 in which at least part of the surface of the nonconsumable anode comprises active oxide, said active oxide comprising oxides of metals with at least 5 mole percent binder metal, at least 10 mole percent group VIII metal and at least 10 mole percent valve metal, said binder metal consisting essentially of at least one metal selected from the group consisting of beryllium, calcium, strontium, barium, scandium, yttrium, lanthanum and the rare earth elements with atomic numbers 58 through 71;

said group VIII metals consisting essentially of at least one metal selected from the group consisting of cobalt, nickel, ruthenium, palladium, iridium and platinum;

and said valve metal consisting essentially of at least one metal selected from the group consisting of titanium, zirconium, hafnium, vanadium, niobium and tantalum.

6. The process of claim 5 in which the binder metal is barium, the group VIII metal is iridium and the valve metal is tantalum.

7. The process of claim 6 in which the metal composition is approximately 5–20 mole percent barium, and the mole ratio of iridium to tantalum is between ¼ and 4.

8. The process of claim 1 in which the cationic membrane is a heterogeneous membrane.

9. The process of claim 8 in which the heterogeneous membrane comprises resin of the sulfonated styrene-divinylbenzene type embedded in matrix comprising polymer selected from the group consisting of polyethylene, polyvinyl chloride, polyvinylidene chloride, natural rubber and synthetic rubber.

10. The process of claim 1 in which the cationic membrane is of the homogeneous type.

11. The process of claim 1 in which the cationic membrane has a perfluorinated structure.

12. The process of claim 11 in which the membrane comprises a copolymer of tetrafluoroethylene and perfluoro 3,6-dioxa-4-methyl-7-octenesulfamic acid.

13. The process of claim 1 in which the electroplating bath comprises copper sulfate in aqueous acid solution.

14. The process of claim 13 in which the electroplating bath further comprises chloride ion.

15. The process of claim 1 in which the organic additive comprises aromatic quaternary amine.

16. The process of claim 15 in which the aromatic quaternary amine is at least one dye of the phenazine class.

17. The process of claim 16 in which the phenazine dye is the Janus Green B type.

18. The process of claim 15 in which the organic additive further comprises at least one aliphatic quaternary amine.

19. The process of claim 18 in which the aliphatic quaternary amine contains between 3 and 10 carbon atoms.

20. The process of claim 15 in which the organic additive further comprises at least one polysulfide compound.

21. The process of claim 15 in which the polysulfide compound is an aliphatic polysulfide compound with the general formula

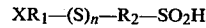

$$XR_1-(S)_n-R_2-SO_2H$$

in which $R_1$ and $R_2$ are alkylene groups with 1 to 6 carbon atoms, X is hydrogen or $SO_3H$ and n varies from 2 to 5.

22. The process of claim 15 in which the organic additive further comprises at least one polyether compound.

23. The process of claim 22 in which the polyether comprises at least 4 ether oxygen atoms and alkyl chains of not more than 6 carbon atoms.

24. The process of claim 22 in which the polyether is polypropylene propanols and glycols of average molecular weight between about 360 and about 1000.

25. The process of claim 22 in which the polyether comprises the group $(C_3H_6O)_y$ where y varies from 6 to 20.

26. The process of claim 22 in which the polyether contains the group $(C_2H_4O)_x$ where x is between 6 and 100.

* * * * *